United States Patent

Tokunaga et al.

Patent Number: 5,445,992
Date of Patent: Aug. 29, 1995

[54] PROCESS FOR FORMING A SILICON CARBIDE FILM

[75] Inventors: Hiroyuki Tokunaga, Fujisawa; Tadashi Atoji, Machida, both of Japan

[73] Assignee: Canon Kabushiki Kaisha, Tokyo, Japan

[21] Appl. No.: 238,725

[22] Filed: May 5, 1994

[30] Foreign Application Priority Data

May 10, 1993 [JP] Japan ............... 5-107973
Apr. 22, 1994 [JP] Japan ............... 6-084580

[51] Int. Cl.⁶ ........................... H01L 21/20
[52] U.S. Cl. ................... 437/100; 117/88; 117/92
[58] Field of Search ........... 437/100; 148/DIG. 148; 117/88, 92

[56] References Cited

U.S. PATENT DOCUMENTS 4,546,008 10/1985 Saitoh et al. ............ 437/100
4,568,626 2/1986 Ogawa .................... 437/100
5,011,706 4/1991 Tarhay et al. ............ 437/100
5,151,296 9/1992 Tokunaga ................ 427/38

FOREIGN PATENT DOCUMENTS 57-103311 6/1982 Japan .
59-172275 9/1984 Japan .
62-113482 5/1987 Japan .
63-136514 6/1988 Japan .
2003912 1/1990 Japan .

Primary Examiner—R. Bruce Breneman
Assistant Examiner—Ramamohan Rao Paladugu
Attorney, Agent, or Firm—Fitzpatrick, Cella, Harper & Scinto

[57] ABSTRACT

A semiconductor film having a very high light response of photoconductivity and good electrical characteristics such a wide band gap, for example, a non-monocrystalline silicon carbide film, is formed by decomposition reaction of a silicon-containing raw material gas and a hydrocarbon as a carbon raw material under light irradiation or high frequency, where the carbon raw material gas comprises at least one of tertiary and quaternary carbon atom-containing hydrocarbons of specific chemical formulae, and a semiconductor device using the thus formed semiconductor film is also provided.

11 Claims, 4 Drawing Sheets

PROCESS FOR FORMING A SILICON CARBIDE FILM

BACKGROUND OF THE INVENTION

1. Field of the Invention

The present invention relates to a process for forming a semiconductor film, particularly a carbon-containing silicon film and a semiconductor device comprising the semiconductor film, and more particularly to a process for forming a semiconductor film having a wide forbidden band gap, such as non-monocrystalline silicon carbide film and a semiconductor device comprising the semiconductor film.

2. Related Background Art

Polysilicon and silicon-based, non-monocrystalline films such as amorphous silicon film are widely applied to photosensitive members, thin film transistors, sensors, photovoltaic elements, etc. A non-monocrystalline silicon carbide film (which will be hereinafter referred to as a-$Si_{1-x}C_x$ film) has been used as a material for the electro-charging layer of the photosensitive member and as a material on the light incident side of a solar cell.

Conventionally, a-$Si_{1-x}C_x$ films are deposited by decomposition reaction of a Si-based gas such as a monosilane gas, a disilane gas, a fluorosilane gas, etc. and a hydrocarbon of linear structure such as methane, ethane, propane, butane, ethylene, acetylene, etc. as raw materials under light irradiation or application of high frequency (JP-A-57-103311; JP-A-59-172275; No. 39 meeting of society of applied physics (1992), Lecture Summary, page 775, 31p-ZT-10). It is also proposed to conduct the deposition by decomposition reaction of an organic silane having a hydrocarbon group such as an alkyl group or an aryl group in the molecule as a raw material (JP-A-62-113482; JP-A-2-3912). It is also proposed to deposit an a-$Si_{1-x}C_x$ film from a carbon raw material gas comprising acetylene as the main component and linear hydrocarbons such as $C_2H_6$, $C_3H_8$, $C_4H_{10}$, $C_5H_{12}$, $C_2H_4$, $C_3H_6$, $C_4H_8$ and $C_5H_{10}$ or their isomers in a mixing ratio of the former to the latter of 0.1 to 10 by volume (JP-A-63-136514).

However, in the formation of an a-$Si_{1-x}C_x$ film using linear hydrocarbons as a carbon raw material gas or an organic silane, the bonding forces of C—H and C—C are stronger than those of Si—H and Si—Si and undergo disassociation with difficulty. That is, the decomposition efficiency of hydrocarbon is so low that with the increasing number of carbon atoms in the hydrocarbons the hydrocarbon gas must be supplied in excess to the silane-based gas. It is also difficult to control the film growth conditions.

Furthermore, a probability of taking the bonds of C—H and C—C as such into the resulting film is high. The C—H bond is hard to break and carbon atoms are often taken into the film together with a plurality of hydrogen atoms in the form of C—Hn, where n=1, 2 or 3. In the non-monocrystalline hydrogenated silicon-based materials, excess hydrogen is generally said to be an electroconduction-inhibiting factor. Particularly in an a-$Si_{1-x}C_x$ film having a high carbon content an excess hydrogen tendency is pronounced, It has been presumed to be difficult to obtain an a-$Si_{1-x}C_x$ film having a wide band gap and very good electrical characteristics.

In the deposition of an a-$Si_{1-x}C_x$ film from a mixture of acetylene as the main carbon raw material with other hydrocarbons, many more unsaturated carbon bonds are taken into the resulting film, thereby preventing formation of an ideal network of Si—C bonds. That is, voids are formed around the unsaturated bonds. The voids inhibit electroconduction and thus it is also hard to obtain an a-$Si_{1-x}C_x$ film having very good electrical characteristics using this method.

SUMMARY OF THE INVENTION

An object of the present invention is to provide a process for forming a semiconductor film having a very good light response of photoconductivity, a wide band gap, and very good electrical characteristics, for example, a non-monocrystalline silicon carbide film.

Another object of the present invention is to provide a process for forming a semiconductor film suitable for a semiconductor device such as an avalanche photodiode, particularly for its photocarrier multiplier layer.

Another object of the present invention is to provide a semiconductor device having a semiconductor film with very good photoconductive characteristics.

Still another object of the present invention is to provide a semiconductor device utilizing an excellent avalanche effect of the semiconductor film.

A further object of the present invention is to provide a process for forming a semiconductor film containing silicon atoms and carbon atoms, which comprises subjecting a silicon-containing raw material gas and a hydrocarbon as a carbon raw material to a decomposition reaction, the carbon raw material comprising at least one member selected from the group consisting of hydrocarbons comprising a tertiary or quaternary carbon atom represented by the following general formulae (I) and (II):

wherein $R_1$ to $R_4$ represent hydrocarbon groups selected from the group consisting of alkyl groups, aryl groups and aromatic groups.

A still further object of the present invention is to provide a semiconductor device, which comprises a semiconductor film containing silicon atoms and carbon atoms, formed by decomposition of a silicon-containing raw material gas and a hydrocarbon as a carbon raw material, the semiconductor film being formed from the carbon raw material comprising at least one member selected from the group consisting of hydrocarbons comprising a tertiary or quaternary carbon atom represented by the following general formulae (I) and (II):

wherein $R_1$ to $R_4$ represent hydrocarbon groups selected from the group consisting of alkyl groups, aryl groups and aromatic groups.

DETAILED DESCRIPTION OF THE PREFERRED EMBODIMENTS

Figure 1:
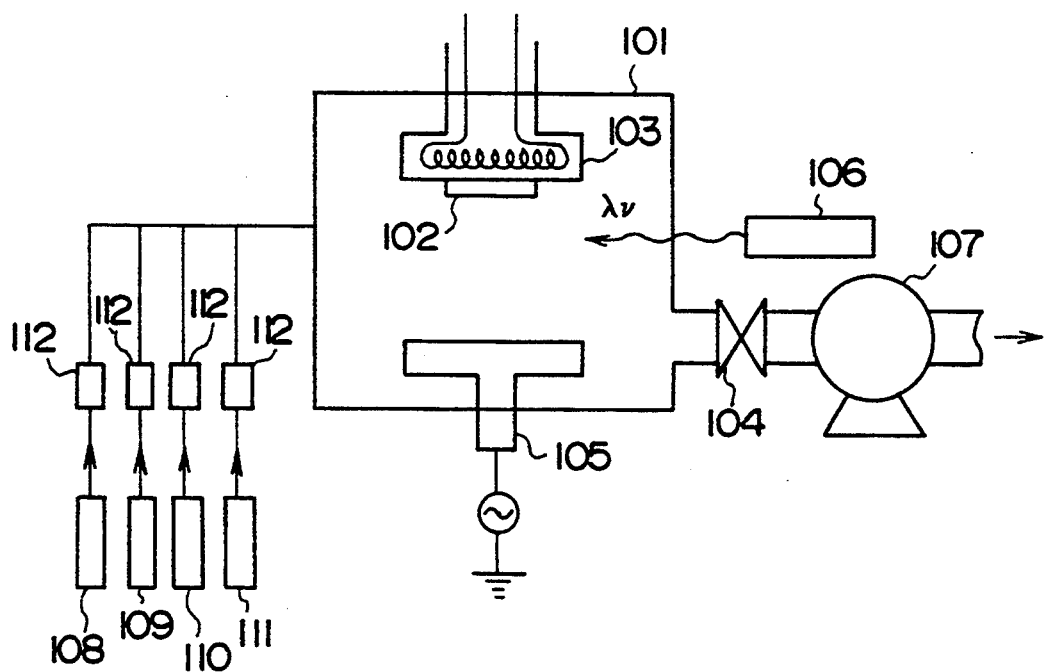
FIG. 1 is a conceptual view of a film-forming system for use in the present invention.

According to the present invention, at least one of a tertiary and quaternary carbon atom-containing hydrocarbons are used as a carbon raw material when a semiconductor film, such as a non-monocrystalline silicon carbide film is formed by decomposition reaction of a silicon-containing raw material gas and a hydrocarbon as a carbon raw material using at least one form of energy selected from light irradiation, application of high frequency, etc.

According to the present invention at least one of tertiary and quaternary carbon atom-containing hydrocarbons as a carbon raw material is decomposed using an energy such as light irradiation or application of high frequency, or the like, thereby generating radicals of tertiary carbon atoms. The generated radicals are allowed to react with active species of silicon hydride to deposit a carbon-containing non-monocrystalline silicon film such as an amorphous silicon carbide film through intermediate products in which the tertiary carbon atoms are combined with silicon hydride, as will be described below, referring to reaction scheme:

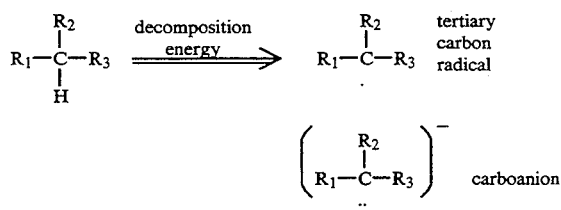

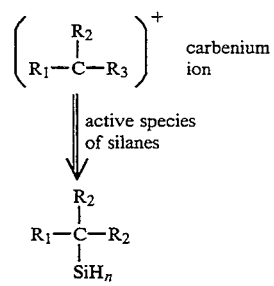

wherein $R_1$ to $R_4$ are hydrocarbon groups such as alkyl groups, aryl groups, aromatic groups, etc. and $R_1$ to $R_4$ contained in the respective radicals and ions are not limited to those given above and numerical suffixes of $R_1$ to $R_4$ are not always in the order given above.

Bond disassociation energy at the most disassociable bond of isobutane and 2, 2-dimethyl-propane, as typical examples of tertiary carbon atom-containing and quaternary carbon atom-containing hydrocarbons, is given below. For comparison, bond disassociation energy of the carbon-hydrogen bonds of methane and ethane as typical comparative examples of primary carbon atom-containing hydrocarbons are also given below.

TABLE 1

| Bond | Bond disassociation energy (Kj/mol) |
|---|---|
| $(CH_3)_3C—H$ | 381 |
| $H_3C—C(CH_3)_3$ | 335 |
| $H_3C—H$ | 435 |
| $CH_3CH_2—H$ | 410 |

TABLE 2

| Bond | Bond disassociation energy (Kj/mol) |
|---|---|
| C—C | 348 |
| C—H | 413 |

It is apparent from these relationships of the bond disassociation energy that hydrogen atoms, alkyl groups, aryl groups, etc. bonded to the tertiary and quaternary carbon atoms will be disassociated by exposing the tertiary or quaternary carbon atom-containing hydrocarbons to an energy from an external source, thereby occasioning excited decomposition of the hydrocarbons. Radicals of the tertiary carbon atom, carboanions and carbenium ions are mainly generated, among which the tertiary carbon atom seems to be most active. It reacts with an active species of likewise excited silicon hydrides to form intermediate products. Then, the alkyl groups, aryl groups, etc. bonded to the tertiary carbon atoms having a low bonding force are disassociated for the same reasons as above to form silicon carbide intermediate products free from C—$H_n$ ($n \geq 2$). Since the C—C bond between the tertiary carbon atom and the alkyl group, aryl groups, etc. is more easily broken than the C—H bond, it seems that an a-$Si_{1-x}C_x$ film of good quality retaining the tertiary carbon atoms bonded to silicon atoms and substantially free from the C—$H_n$ bonds ($n \geq 2$) can be deposited by controlling the reaction conditions so as to preferentially disassociate the more readily broken C—C bonds at that time.

The inventors have conducted the following preliminary test to establish the present invention.

In deposition of silicon carbide films, using a silane as a silicon raw material by plasma CVD, proportions of C—$H_n$ bonds in the film when (1) methane or (2) isobutane was used as a carbon raw material were determined.

The following film forming conditions were used in the test:

| Reactor volume | 8 liters |
|---|---|
| SiH$_4$ | 2 sccm |
| H$_2$ | 100 sccm |
| Reaction pressure | 200 m Torr |
| Substrate temperaturec | 250° C. |
| (1) CH$_4$ | 60 sccm |
| (2) i-C$_4$H$_{10}$ | 60 sccm |
| RF power | 0.03 W/cm$^{-2}$ |

Figure 2:
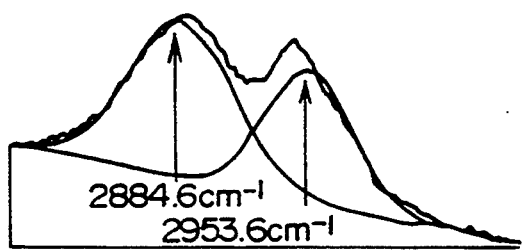
FIG. 2 is an IR absorption spectrum of an a-$Si_{1-x}C_x$ film using methane as carbon raw material.
Figure 3:
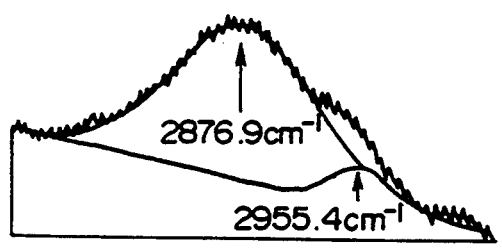
FIG. 3 is an IR absorption spectrum of an a-$Si_{1-x}C_x$ film using isobutanes as carbon raw material.

These films were deposited on non-doped silicon wafers, respectively, to a thickness of 2,000 Å and subjected to an infrared (CR) absorption analysis, whereby spectra as shown in FIGS. 2 and 3 were obtained. The absorption of stretching mode of C—H bonds appeared at 2,800–3,000 cm$^{-1}$ because the oscillator strength was changed due to the numbers of the hydrogen atoms bonding to the C carbon. That is, the C—H bond appeared at 2,880 cm$^{-1}$, the C—H$_2$ bond at 2,930 cm$^{-1}$ and the C—H$_3$ bond at 2,960 cm$^{-1}$. In FIGS. 2 and 3 there are two peaks at about 2,885 cm$^{-1}$ and about 2,955 cm$^{-1}$. Thus peak separation was carried out by to Gaussian approximation. The absorption of infrared beam underwent mutual interference of C—$H_n$ bonds themselves, or that with the Si—H bond, etc., causing a peak shift to some extent. Thus, it was presumed that the peak at 2,885 cm$^{-1}$ showed the C—H bond and the peak at 2,955 cm$^{-1}$ showed the C—$H_n$ bond. As is apparent from FIGS. 2 and 3, the peak intensity at about 2,955 cm$^{-1}$ in FIG. 3 using isobutane as a carbon raw material is considerably lower. From this it can be seen that the number of C—$H_n$ bonds can be considerably decreased by using isobutane as a carbon raw material.

The energy gap of films made from methane as a carbon raw material was determined by optical absorption and found to be 2.15 eV. Energy gap of films made from isobutane was found to be 2.01 eV.

These films were irradiated with a monochromatic light having a wavelength of 350 nm and a sufficiently higher energy level than the energy gas. A change in the electroconductivity from the dark state was $5 \times 10^{-9}$ $(\Omega cm)^{-1}$ in case of using isobutane and $6 \times 10^{-10} (\Omega cm)^{-1}$ in case of using methane. That is, it was found the light response was improved in the electroconductivity in case of using isobutane as a hydrocarbon raw material.

FIG. 1 is a schematic structural view showing one embodiment of a film-forming system suitable for the present invention.

A heat-resistant substrate 102 of e.g. glass, silicon wafer, quartz, metal, ceramic, or the like is provided in a reactor vessel 101 evacuated to vacuum by a vacuum exhausting pump 107, and heated to an appropriate temperature by a heater 103.

A silicon raw material gas such as Si$_n$H$_m$, Si$_n$H$_m$F$_k$, Si$_n$H$_m$R, etc., where n, m and k=0, 1, 2, 3, 4, ...; R =a hydrocarbon group such as an alkyl group, an aryl group, etc., and mainly at least one of tertiary carbon atom-containing and quaternary carbon atom-containing hydrocarbons as a carbon raw material are introduced from 108–111 into the reactor vessel 101 while controlling mass flow controllers 112 and adjusted to a desired pressure by a conductance valve 104. An a-SiC film is deposited by reaction of the silicon raw material with the carbon raw material while supplying a decomposition energy.

The substrate 102 for use in the deposition may be provided with an electrode or an integrated circuit on the surface. It is desirable that the substrate temperature is usually 100° to 500° C., preferably 150° to 350° C., and more preferably 200° to 300° C.

Preferable silicon raw materials for use in the present invention include, for example, silane hydrides, silane fluorides, silane hydride-fluorides, and organic silanes.

Preferable carbon raw materials for use in the present invention include tertiary and quaternary carbon atom-containing hydrocarbons, for example, isobutanes, isopentanes, 2, 2-dimethylpropane, 2-methylpentane, 3-methylpentane, 2-ethylbutane, 2-dimethyl-4-pentene, 2-methyl-2-phenylpropane, etc. The hydrocarbons may contain an unsaturated bond, when required. Other kinds of hydrocarbon gas may be used together with these hydrocarbons at the same time. However, acetylene (C$_2$H$_2$) is not preferred, because its decomposition efficiency is high due to the triple bond, and the probability of taking an unsaturated carbon bond into the resulting silicon carbide film is high. However, the electroconductivity characteristics of the resulting silicon carbide film is not greatly deteriorated if acetylene is used in a mixing ratio of acetylene to the tertiary or quaternary carbon atom-containing hydrocarbons of less than 10%.

Still furthermore, hydrogen or an inert gas can be used as a dilution gas at the same time. A doping gas can be also used to control the conductivity type.

Decomposition energy can be supplied to the reactor vessel, for example, by applying a high frequency wave such as RF, VHF, microwave, etc. thereto, by light irradiation, by heating to thermally decompose the raw material gases. A plurality of these procedures for supplying the energy can be used at the same time.

It is desirable that the amount of the tertiary and quaternary carbon atom-containing hydrocarbons is at least 90% by mole of total raw material gases used for introducing the carbon atoms.

EXAMPLES

The present invention will be described in detail below.

EXAMPLE 1

Figure 4:
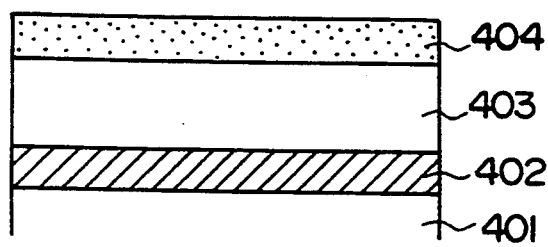
FIG. 4 is a schematic cross-sectional view of a semiconductor device for evaluation of electrical characteristics, using an a-$Si_{1-x}C_x$ film according to the present invention.

FIG. 4 shows a cross-sectional structure of a semiconductor device as a test piece according to the present invention.

A Cr film 402 was deposited on a quartz substrate 401 to a thickness of 2,000 Å by EB (electron beam) vacuum vapor deposition. Then, the thus obtained vacuum vapor deposited substrate was set in a vacuum film-forming system shown in FIG. 1 to form an a-Si$_{1-x}$C$_x$ film 403 thereon to a thickness of 2,000 Å by plasma CVD under the following conditions:

| Reactor volume | 8 liters |
|---|---|
| SiH$_4$ | 2 sccm |
| H$_2$ | 100 sccm |
| i-C$_4$H$_{10}$(isobutane) | 100 sccm |
| Reaction pressure | 200 m Torr |
| Substrate temperature | 250° C. |

-continued

| | |
|---|---|
| RF power | 0.06 W/cm² |

Then, a Pt film 404 was deposited thereon to a thickness of 100 Å by EB vacuum vapor deposition, whereby a semiconductor device having a photoelectric conversion function could be obtained.

At the same time only an a-$Si_{1-x}C_x$ film was deposited on a quartz substrate and its optical band gap was measured. It was 2.80 eV.

COMPARATIVE EXAMPLE 1

Conditions for forming an a-$Si_{1-x}C_x$ film by plasma CVD were changed to the following ones, while other conditions and the structure of a test piece were the same as in Example 1:

| | |
|---|---|
| Reactor volume | 8 liters |
| SiH₄ | 2 sccm |
| H₂ | 100 sccm |
| CH₄(methane) | 100 sccm |
| Reaction pressure | 200 m Torr |
| Substrate temperature | 250° C. |
| RF power | 0.03 W/cm² |

At the same time, only an a-$Si_{1-x}C_x$ film was deposited on a quartz substrate, and the optical band Gap was measured. It was 2.85 eV.

COMPARATIVE EXAMPLE 2

Conditions for forming an a-$Si_{1-x}C_x$ film by plasma CVD were changed to the following ones, while other conditions and the structure of a test piece were the same as in Example 1:

| | |
|---|---|
| Reactor volume | 8 liters |
| SiH₄ | 2 sccm |
| H₂ | 100 sccm |
| C₄H₁₀(n-butane) | 100 sccm |
| Reaction pressure | 40 m Torr |
| Substrate temperature | 250° C. |
| RF power | 0.06 W/cm² |

At the same time, only an a-$Si_{1-x}C_x$ film was deposited on a quartz substrate, and the optical band gap was measured. It was 2.81 eV.

The test pieces of Example 1 and Comparative Examples 1 and 2 were each irradiated with a monochratic light having a wave length of 350 nm. Changes in the electroconductivity from the dark condition (without light irradiation) are shown in the following Table 3:

TABLE 3

| | Change in electroconductivity $(\Omega cm)^{-1}$ |
|---|---|
| Example 1 (SiC made from i-C₄H₁₀) | $4 \times 10^{-11}$ |
| Comp. Ex. 1 (SiC made from CH₄) | $5 \times 10^{-12}$ |
| Comp. Ex. 2 (SiC made from n-C₄H₁₀) | $2 \times 10^{-12}$ |

From Table 3 it can be seen that the test piece of Example 1 using isobutane as a hydrocarbon raw material had a higher light response of electroconductivity by about one order of magnitude.

EXAMPLE 2

Only conditions for forming an a-$Si_{1-x}C_x$ film by plasma CVD were changed to the following one, which other conditions and the structure of a test piece were the same as in Example 1:

| | |
|---|---|
| Reactor volume | 8 liters |
| SiH₄ | 2 sccm |
| H₂ | 100 sccm |
| H₃C—C(CH₃)₂—CH₃ (2,2-dimethylpropane) | 130 sccm |
| Reaction pressure | 200 m Torr |
| Substrate temperature | 250° C. |
| RF power | 0.03 W/cm² |

At the same time only an a-$Si_{1-x}C_x$ film was deposited on a quartz substrate and the optical band gap was measured. It was 2.78 eV.

Change in the electroconductivity was determined likewise by irradiation with a light at 350 nm and found to be $2 \times 10^{-11}$ $(\Omega cm)^{-1}$. It can be seen from this that the test piece of Example 2 using 2,2-dimethylpropane has a higher light response of electroconductivity than that of comparative Example 1 using methane as a carbon raw material.

EXAMPLE 3

Only conditions for forming an a-$Si_{1-x}C_x$ film by plasma CVD were changed to the following ones, while other conditions and the structure of a test piece were the same as in Example 1.

| | |
|---|---|
| Reactor volume | 8 liters |
| SiH₄ | 2 sccm |
| H₂ | 100 sccm |
| i-C₅H₁₂(isopentane) | 150 sccm |
| CH₄(methane) | 20 sccm |
| Reaction pressure | 200 m Torr |
| Substrate temperature | 250° C. |
| RF power | 0.03 W/cm² |

At the same time only an a-$Si_{1-x}C_x$ film was deposited on a quartz substrate and the optical band gap was measured. It was 2.82 eV.

Change in the electroconductivity was determined likewise by irradiation with a light at 350 nm and found to be $2 \times 10^{-11} (\Omega cm)^{-1}$. It can be seen from this that the test piece of Example 3 using a mixed gas of methane and isopentane has a higher light response of electroconductivity than that of comparative Example 1 using methane as a carbon raw material.

EXAMPLE 4

Conditions for forming an a-$Si_{1-x}C_x$ film by plasma CVD were changed to the following ones, while other conditions and the structure of a test piece were the same as in Example 1:

| | |
|---|---|
| Reactor volume | 8 liters |
| SiH₂F₂ | 2 sccm |
| H₂ | 100 sccm |
| i-C₄H₁₀(isobutane) | 100 sccm |
| Reaction pressure | 200 m Torr |

| | |
|---|---|
| Substrate temperature | 250° C. |
| RF power | 0.03 W/cm² |

At the same time, only an a-Si$_{1-x}$C$_x$ film was deposited on a quartz substrate, and the optical band gap was measured. It was 2.70 eV.

COMPARATIVE EXAMPLE 3

Only conditions for forming an a-Si$_{1-x}$C$_x$ film by plasma CVD were changed to the following ones while other conditions and the structure of a test piece were the same as in Example 1:

| | |
|---|---|
| Reactor volume | 8 liters |
| SiH$_2$F$_2$ | 2 sccm |
| H$_2$ | 100 sccm |
| CH$_4$ (methane) | 20 sccm |
| Reaction pressure | 200 m Torr |
| Substrate temperature | 250° C. |
| RF power | 0.03 W/cm² |

At the same time, only an a-Si$_{1-x}$C$_x$ film was deposited on a quartz substrate, and the optical band gap was measured. It was 2.75 eV.

Changes in the electroconductivity of test pieces of Example 4 and Comparative Example 3 were determined likewise by irradiation with light at 350 nm and found to be $2 \times 10^{-11} (\Omega cm)^{-1}$ in case of the test piece of Example 4 and $3 \times 10^{-12} (\Omega cm)^{-1}$ in case of the test piece of Comparative Example 3. It can be seen from this that the test piece of Example 4 using even SiH$_2$F$_2$ as a silicon raw material has a higher light response of electroconductivity than that of comparative Example 3 using methane as a carbon raw material.

EXAMPLE 5

Conditions for forming an a-Si$_{1-x}$C$_x$ film were changed to the following ones where the decomposition energy applied during the deposition of an a-Si$_{1-x}$C$_x$ film was changed to irradiation with ultraviolet ray generated by KrF excimer laser right on the substrate, while the structure of a test piece was the same as in Example 1:

| | |
|---|---|
| Reactor volume | 8 liters |
| SiH$_4$ | 2 sccm |
| H$_2$ | 100 sccm |
| i-C$_4$H$_{10}$(isobutane) | 100 sccm |
| Reaction pressure | 200 m Torr |
| Substrate temperature | 280° C. |
| Laser power | 2W |

At the same time, only an a-Si$_{1-x}$C$_x$ film was deposited on a quartz substrate, and the optical band gap was measured. It was 2.65 eV. Change in the electroconductivity of the test piece was determined likewise by irradiation with light at 350 nm and was found to be $3 \times 10^{-11} (\Omega cm)^{-1}$.

EXAMPLE 6

An avalanche photodiode (APD) having a photocarrier multiplier layer (an ionization layer and an electron potential-elevating layer) using a band gap modulation as a preferable embodiment of the present semiconductor device will be described below.

Figure 5:
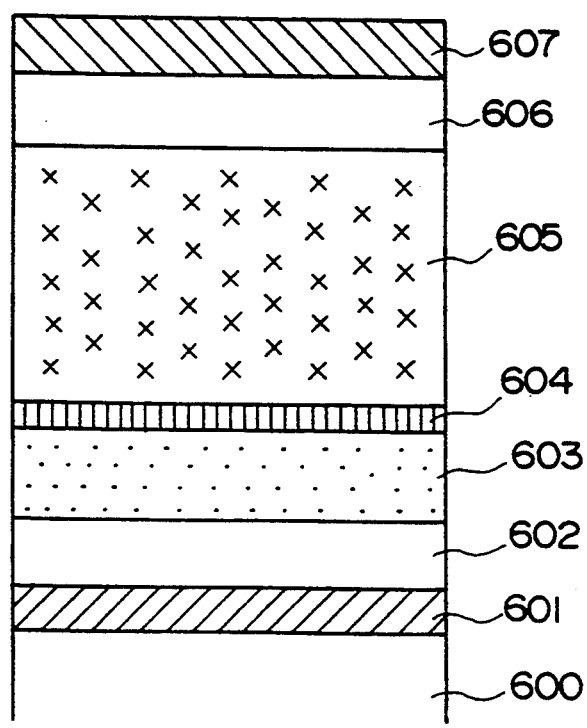
FIG. 5 is a schematic cross-sectional view of an APD (avalanche photodiode), using an a-$Si_{1-x}C_x$ film according to the present invention.
Figure 6:
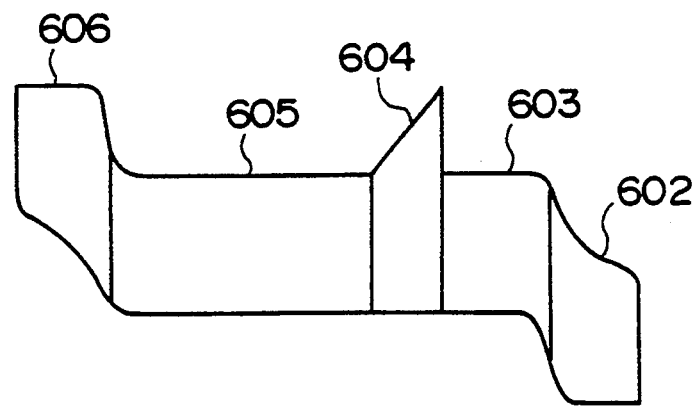
FIG. 6 is a schematic view of the band structure of an APD using an a-$Si_{1-x}C_x$ film according to the present invention.

FIG. 5 is a schematic cross-sectional view of the present device and FIG. 6 is a schematic view of the band structure of the device.

At first, a Ti electrode 601 was deposited to a thickness of 2,000 Å onto a glass substrate 600 by EB vapor deposition. Then, the vapor deposited substrate was set in a plasma CVD apparatus, and SiH$_4$ gas was introduced therein at a flow rate of 60 sccm and PH$_3$ gas diluted to 10% by H$_2$ gas was also introduced therein at a flow rate of 20 sccm at the same time, and a high frequency discharge was conducted under a total gas pressure of 0.2 Torr to deposit a hole-blocking layer 602 as an n-type, highly doped layer of non-monocrystalline hydrogenated silicon (for example, amorphous hydrogenated silicon a-Si : H) to a thickness of about 1,000 Å, where the substrate temperature was 250° C. and the discharge power density was about 0.15 W/cm².

Then, a non-monocrystalline silicon-germanium layer 603 (for example, amorphous silicon-germanium a-SiGe layer) having a band gap of 1.55 eV was deposited thereon as a carrier ionization layer to a thickness of 2,000 Å.

Then, an a-Si$_{1-x}$C$_x$ film 604 as electron potential-elevating layer whose band gap was continuously decreased toward a light absorption layer 605 in the film thickness direction, as shown in FIG. 6 was deposited thereon to a thickness of 600 Å by plasma CVD under the conditions shown in Tables 4 and 5. In other words, the carbon atom concentration was changed in the film thickness direction. That is, the carbon atom content was decreased toward the light absorption layer.

In Table 5 the band gaps of arbitrarily selected regions of the film with continuously changing carbon atom concentration and conditions for forming the arbitrarily selected regions of the film are shown, and the spin density (Ns) is a value obtained by ESR analysis when the film was deposited to a thickness of 3,000 Å while setting the conditions constant at that time. Gas flow rates in the regions not given in Table 5 were linearly changed between the flow rates listed in Table 5.

TABLE 4

| | Substrate temperature |
|---|---|
| a-Si$_{1-x}$C$_x$ | 250° C. (constant, irrespective of x) |

TABLE 5

| Eg (ev) | 3.42 | 3.10 | 2.65 | 2.38 | 2.10 | 1.94 | 1.73 |
|---|---|---|---|---|---|---|---|
| Gas flow rates (sccm) | | | | | | | |
| SiH$_4$ | 4 | 4 | — | — | 8 | 10 | 10 |
| iC$_4$H$_{10}$ | 70 | 30 | 20 | 10 | 5 | — | — |
| CH$_4$ | — | — | 5 | 10 | 20 | 10 | — |
| H$_2$ | — | — | — | — | 20 | 40 | 50 |
| Pressure (Torr) | 0.04 | 0.04 | 0.06 | 0.08 | 0.12 | 0.20 | 0.20 |
| RF power (W/cm²) | 0.10 | 0.10 | 0.08 | 0.06 | 0.05 | 0.05 | 0.05 |
| Ns (× 10$^{18}$/cm) | 1.8 | 1.7 | 1.7 | 1.6 | 1.3 | 0.1 | — |

(Eg = 1.73eV is Ns < 10$^{17}$ cm$^{-3}$)

Then, an a-Si was deposited thereon to a thickness of 6,000 Å as the light absorption layer 605 by discharging under the following conditions:

| | |
|---|---|
| SiH₄ gas flow rate: | 50 sccm |
| H₂ gas flow rate: | 60 sccm |
| Total gas pressure: | 0.2 Torr |
| HF power: | about 0.06 W/cm² |
| Substrate temperature: | 250° C. |

Then, a P layer 606 was deposited further thereon to a thickness of 1,000 Å as electron blocking layer by discharging under the following conditions:

| | |
|---|---|
| SiH₄ gas flow rate: | 0.6 sccm |
| H₂ gas flow rate: | 280 sccm |
| Gas flow rate of BF₃ diluted to 1,000 ppm by He as doping gas: | 18 sccm |
| Total gas pressure: | 0.25 Torr |
| Substrate temperature: | 160° C. |
| HF power: | about 0.25 W/cm² |

Finally, a transparent electrode 607 of indium-tin oxide (ITO) was deposited thereon to a thickness of 100 Å by RF sputtering to form a photodiode.

COMPARATIVE EXAMPLE 4

Only conditions for depositing the electron potential-enhancing layer 604 was changed to those given in Tables 6 and 7 without using isobutane in the production of an avalanche photodiode having the same structure as that of Example 6.

In Table 7, band gaps of arbitrarily selected regions of the film with continuously changing carbon atom concentration and conditions for forming the arbitrarily selected regions are shown, and the spin density (Ns) is a value obtained by ESR analysis when the film was deposited to a thickness of 3,000 Å while setting the conditions constant at that time.

TABLE 6

| | Substrate temperature | Total pressure | RF power |
|---|---|---|---|
| a-Si₁₋ₓCₓ | 250° C. | 0.2 Torr | 0.05W/cm² (constant, irrespective of x) |

TABLE 7

| Eg (ev) | 3.52 | 3.12 | 2.72 | 2.42 | 2.25 | 1.94 | 1.73 |
|---|---|---|---|---|---|---|---|
| Gas flow rates (sccm) | | | | | | | |
| SiH₄ | 2 | 2 | 3 | 4 | 5 | 10 | 10 |
| CH₄ | 200 | 120 | 72 | 50 | 30 | 10 | — |
| H₂ | — | — | 20 | 30 | 40 | 50 | 50 |
| Ns (× 10¹⁸/cm) | 3.6 | 2.5 | 2.2 | 2.5 | 2.1 | 0.1 | — |

(Eg = 1.73eV is Ns < 10¹⁷ cm⁻³)

A photodiode was prepared in the same manner as in Example 6 except for the electron potential-elevating layer 604.

COMPARATIVE EXAMPLE 5

A PIN type photodiode without the photocarrier multiplier layer (an ionization layer and an electron potential-enhancing layer) was prepared for comparison.

Figure 7:
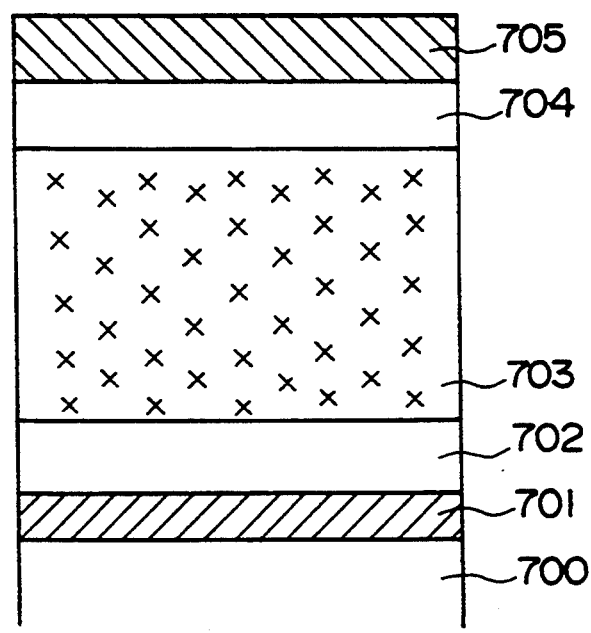
FIG. 7 is a schematic view of the band structure of a PIN type photodiode.
Figure 8:
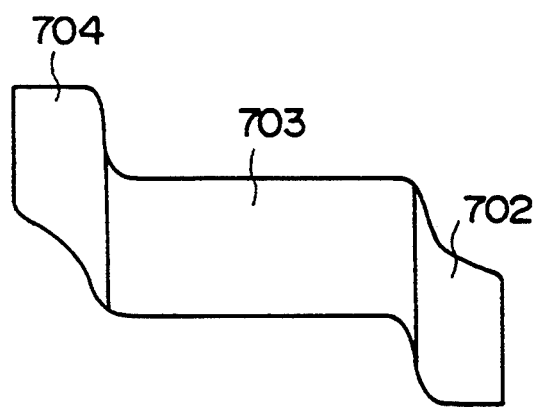
FIG. 8 is a schematic view of the band structure of a PIN type photodiode.

FIG. 7 is a schematic cross-sectional view of the PIN type photodiode and FIG. 8 is a schematic view of the bond structure of the photodiode.

At first, a Ti electrode 701 was deposited to a thickness of 2,000 Å onto a glass substrate 700 by EB vapor deposition. Then, the vapor deposited substrate was set in a plasma CVD apparatus, and a SiH₄ gas was introduced therein at a flow rate of 60 sccm and PH₃ gas diluted to 10% by H₂ gas was also introduced therein at a flow rate of 20 sccm at the same time, and a high frequency discharge was conducted under a total gas pressure of 0.2 Torr to deposit a hole-blocking layer 702 as n-type, highly doped layer of a-Si:H to a thickness of about 1,000 Å, where the substrate temperature was 250° C. and the discharge power density was about 0.15 W/cm².

Then, an a-Si was deposited thereon to a thickness of 6,000 Å as the light absorption layer 703 by discharging under the following conditions:

| | |
|---|---|
| SiH₄ gas flow rate: | 50 sccm |
| H₂ gas flow rate: | 60 sccm |
| Total gas pressure: | 0.2 Torr |
| HF power: | about 0.06W/cm² |
| Substrate temperature: | 250° C. |

Then, a P layer 704 was deposited further thereon to a thickness of 1,000 Å as electron blocking layer by discharging under the following conditions:

| | |
|---|---|
| SiH₄ gas flow rate: | 0.6 sccm |
| H₂ gas flow rate: | 280 sccm |
| Gas flow rate of BF₃ diluted to 1,000 ppm by He as doping gas: | 18 sccm |
| Total gas pressure: | 0.25 Torr |
| Substrate temperature: | 160° C. |
| HF power: | about 0.25W/cm² |

Finally, a transparent electrode 705 of indium-tin oxide (ITO) was deposited thereon to a thickness of 100 Å by RF sputtering to form a photodiode.

Current increases of the photodiodes prepared in Example 6 and Comparative Examples 4 and 5, when exposed to irradiation of light at 577 nm are shown in the following Table 8, where the current increase is the difference between the photocurrent saturated with increasing applied voltage and the dark current in case of APD. The electrode area used was 3 mm² in all these cases. At that time, these photodiodes had $\lambda = 1$ and the photocurrent was a primary photocurrent.

TABLE 8

| | Current increase (A) |
|---|---|
| Example 6 (APD with a photocarrior multiplier layer made from i-C₄H₁₀) | 1.7 (× 10⁻⁶) |
| Comp. Ex. 4 (APD with a photocarrier multiplier layer a made from CH₄) | 1.4 |
| Comp. Ex. 5 (PIN diode without any photocarrier multiplier layer) | 1.2 |

As is apparent from Table 8, amorphous silicon-based APD with a high multiplication factor can be prepared by using a-Si₁₋ₓCₓ prepared from a carbon raw material gas having isobutane mixed in the carrier amplifying layer.

EXAMPLE 7

Figure 9:
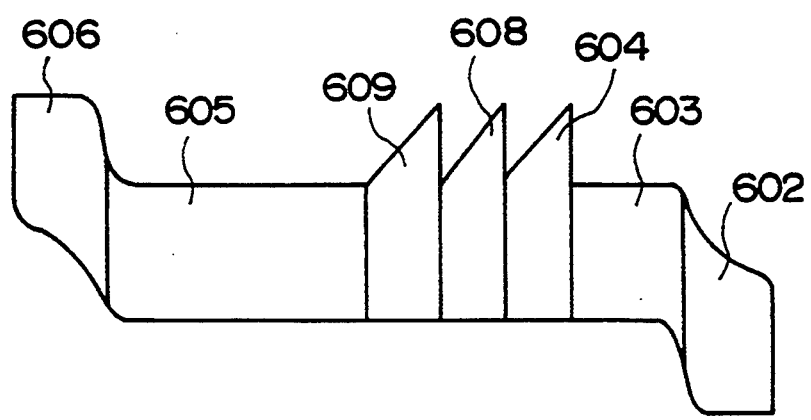
FIG. 9 is a schematic view of the band structure of an APD having multiplier layer of a plurality of stages using an a-$Si_{1-x}C_x$ film according to the present invention.

An avalanche photodiode was prepared in the same manner as in Example 6, except that the electron potential-elevating layer 604 of the same structure as that of the avalanche photodiode of Example 6 was deposited by two more layers to form three stages 604, 608 and 609 as shown in FIG. 9.

The photodiodes prepared in Examples 6 and 7 were irradiated with light having a wavelength of 577 nm under application of a voltage between the electrodes of the photodiodes and the increase in current at that time was measured. The results are shown in Table 9. In the case of APD, the "increase in current" means the value obtained by subtracting the current (i.e., dark current) which flows across a diode when not irradiated with light from the saturation value of the current (i.e., photocurrent) which flows across the diode when irradiated with a sufficiently strong light.

The area of the electrodes of the photodiodes used were all 3 mm². At that time, the photodiodes all had $\lambda = 1$, which means that the photocurrent is proportional to the quantity of incident light. The photocurrent measured was a primary photocurrent.

TABLE 9

|  | Current increase (A) |
| --- | --- |
| Example 6 (APD with one stage of photocarrier multiplier layer) | $1.7 \, (\times 10^{-6})$ |
| Example 7 (APD with 3 stages of photocarrier multiplier layer) | 4.8 |

As is apparent from Table 9, the photosensitivity can be considerably improved by preparing an ADP of a plurality of stages of the photocarrier multiplier layers, using a-Si$_{1-x}$C$_x$ prepared from a carbon raw material gas having isobutane mixed in the photocarrier multiplier layers.

As described in detailed above, the present invention provides a non-monocrystalline silicon carbide film having a wide band gap and good electrical characteristics and also a semiconductor device comprising the thus obtained film, which has much distinguished characteristics.

The present invention will not be limited only to the foregoing Examples and can be modified and combined within the spirit of the present invention.

What is claimed is:

1. A chemical vapor deposition process for forming a semiconductor film containing silicon carbide, which comprises subjecting a silicon-containing raw material gas and a hydrocarbon as a carbon raw material to a decomposition reaction, the carbon raw material comprising at least one member selected from the group consisting of hydrocarbons comprising tertiary or quaternary carbon atom represented by the following general formulae (I) and (II):

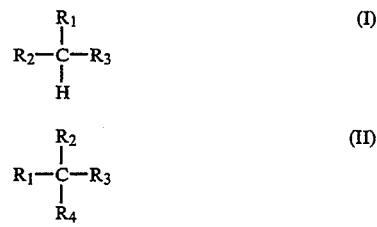

wherein R$_1$ to R$_4$ represent hydrocarbon groups selected from the group consisting of alkyl groups, aryl groups and aromatic groups.

2. A process according to claim 1, wherein the decomposition reaction is carried out under at least one form of energy selected from the group consisting of light irradiation, high frequency and heat.

3. A process according to claim 1, wherein the selected hydrocarbon is a mixture of at least two of the tertiary and quaternary carbon atom-containing hydrocarbons.

4. A process according to claim 1, wherein the tertiary and quaternary carbon atom-containing hydrocarbons are isobutanes.

5. A process according to claim 1, wherein the tertiary and quaternary carbon atom-containing hydrocarbons are 2, 2-dimethylpropane.

6. A process according to claim 1, wherein the tertiary and quaternary carbon atom-containing hydrocarbons are isopentanes.

7. A process according to claim 1, wherein the tertiary and quaternary carbon atom-containing hydrocarbons take at least 90% by mole of the carbon raw material gas.

8. A process according to claim 1, wherein the semiconductor film containing the silicon atoms and the carbon atoms comprises non-monocrystalline silicon carbide.

9. A process according to claim 8, wherein the non-monocrystalline silicon carbide comprises amorphous silicon carbide.

10. A process according to claim 8, wherein the non-monocrystalline silicon carbide has an optical energy gap of at least 2.0 eV.

11. A process according to claim 1, wherein a hydrogen gas or an inert gas is used as a dilution gas.

* * * * *